United States Patent
Hussong et al.

[11] Patent Number: 6,123,585
[45] Date of Patent: Sep. 26, 2000

[54] MODULE FOR CONNECTING ACTUATORS AND/OR SENSORS

[75] Inventors: Wolfgang Hussong, Nürnberg; Michael Freimuth, Hirschau; Wolfgang Schatz, Amberg, all of Germany

[73] Assignee: Siemens Aktiengesellschaft, Munich, Germany

[21] Appl. No.: 09/403,162

[22] PCT Filed: Apr. 6, 1998

[86] PCT No.: PCT/DE98/00974

§ 371 Date: Oct. 15, 1999

§ 102(e) Date: Oct. 15, 1999

[87] PCT Pub. No.: WO98/48489

PCT Pub. Date: Oct. 29, 1998

[30] Foreign Application Priority Data

Apr. 17, 1997 [DE] Germany ............ 197 16 137

[51] Int. Cl.[7] ............................................. H01R 25/00
[52] U.S. Cl. ............................................. 439/652
[58] Field of Search ........................ 439/535, 652, 439/527, 536, 762

[56] References Cited

U.S. PATENT DOCUMENTS

| | | | |
|---|---|---|---|
| D. 397,088 | 8/1998 | Heung et al. ............ | D13/139.6 |
| 4,995,818 | 2/1991 | Saimoto ............ | 439/74 |
| 5,011,417 | 4/1991 | Matsumoto et al. ............ | 439/76 |
| 5,581,130 | 12/1996 | Boucheron . | |
| 5,764,487 | 7/1998 | Natsume ............ | 361/775 |
| 5,780,775 | 7/1998 | Yu ............ | 174/135 |
| 5,788,529 | 8/1998 | Borzi et al. ............ | 439/364 |
| 5,914,863 | 6/1999 | Shen ............ | 361/752 |

FOREIGN PATENT DOCUMENTS

| | | |
|---|---|---|
| 0 473 336 | 3/1992 | European Pat. Off. . |
| 0 740 365 | 10/1996 | European Pat. Off. . |
| 36 03 750 | 8/1987 | Germany . |
| 40 05 086 | 8/1991 | Germany . |
| 44 12 270 | 10/1995 | Germany . |
| 44 37 316 | 4/1996 | Germany . |
| 296 07 525 U | 8/1996 | Germany . |
| 196 06 481 | 3/1997 | Germany . |
| WO 94/24725 | 10/1994 | WIPO . |

*Primary Examiner*—Paula Bradley
*Assistant Examiner*—P Nguyen
*Attorney, Agent, or Firm*—Kenyon & Kenyon

[57] ABSTRACT

A module for connecting actuators and/or sensors having a housing that can be mounted on a base and a contact unit with contact pins. To enable the connection of a round cable, at the same time maintaining a simple design and easy contacting, the proposed base has an accommodating element projecting beyond the housing with an accommodating aperture for a plug coupling of a round cable connection that can be brought into contact with a connector, with the connector having contact elements that can engage with the contact pins.

12 Claims, 3 Drawing Sheets

MODULE FOR CONNECTING ACTUATORS AND/OR SENSORS

FIELD OF THE INVENTION

The present invention relates to a module for connecting actuators and/or sensors having a housing that can be mounted on a base and has a contact unit with contact pins.

BACKGROUND INFORMATION

Modules for connecting actuators and/or sensors, which can be purchased on the electronics market, have standardized outer dimensions and mounting hole patterns as well as standardized load feeders. Electric module circuits in the form of p.c. boards, for example, are built into a housing that is mounted on site. For example, a number of modules of this type are provided in a production island in an automobile manufacturing plant. In this case, auxiliary power or control signals, for example, which can be picked off in the form of actuator or sensor outputs at the module load feeders or fed to these circuits via corresponding inputs, are supplied to one or to each of these modules via a cable (actuator/sensor interface bus). For example, a sensor signal of a photoelectric barrier can be supplied to one input of the module in the form of an input signal, while the auxiliary power and/or control signals can be applied via an output of the module, e.g., an actuator in the form of a relay.

The auxiliary power and control signals are conventionally supplied to the module via two flat cables, which are connected to the module after the latter has been positioned and assembled. Contact domes that are provided on the module housing and whose contacts are connected to the p.c. board provided in the housing according to the corresponding electric circuit can be used to establish connections to the various loads. However, the use of flat cables has proven to be highly problematic, especially in areas with extreme external conditions. In welding plants of the metal-working industry, for example, the flat cables are irreversibly damaged by red-hot welding beads, particularly on their corners.

SUMMARY

The present invention is based on the recognition that round cables are more resistant to extreme external conditions of this type. An object of the present invention is therefore to provide a module which has a simple design and also allows a round cable to be contacted and the module to be easily assembled and serviced.

According to the present invention, this object is achieved by providing the base with an accommodating element that projects above the housing and has an accommodating aperture for a plug coupling of a round cable connection that can be brought into contact with a connector, with the connector having contact elements that can engage with the contact pins. A round cable connection is understood to be a rectangular or round plug connection, in particular for a rectangular plug or for a round plug.

According to one advantageous embodiment, the accommodating element is molded onto one free end of the base. This molded projection is suitably designed so that it has a conical shape in the longitudinal direction of the module, with the accommodating aperture for the plug coupling being positioned at a right angle to the plane of the base. The conical free end of the outer member may have a rounded outer contour that matches the shape of the accommodating aperture.

To use the contact pins extending out of the housing, i.e., the electrical connection between the module and the previously used flat cable as well as all mechanical and design properties of the housing, without any changes, the connector suitably has a contact plate which holds both the contact elements and the connecting elements for the plug coupling. The contact plate, and thus the connector, is designed so that the contact elements correspond to the contact pins or contact spikes when the module is assembled. The connector thus forms a kind of adapter for connecting round cables with different mechanical dimensions and wire strand designs which can be easily plugged into the plug coupling for this purpose.

The connector in the form of the contact plate holding the plug coupling can be preferably mounted on the bottom of the base from below, with openings corresponding to the contact pins as well as to the contact elements of the connector being provided in the contact area on the top of the base. The contact pins for contacting the contact elements are then introduced through these openings during assembly.

According to one embodiment, the contact elements are designed in the form of flat spring elements or goblet springs. Alternatively, a conductor segment which is positioned in a retaining groove located in the contact area can be provided as the contact element. This retaining groove is suitably provided on the top of the base, i.e. in the contact area. Alternatively, the one or each retaining groove can also be provided in the contact plate and thus in the connector.

To achieve an especially high degree of protection, e.g., IP 67, a recess for a flat gasket can be provided for sealing the contact area on the top of the base. The one or each retaining groove for the corresponding conductor segment can then also be provided in this recess.

To also connect one or more further flat cables to the module, the base advantageously has at least one additional retaining groove along the length of the contact area which matches the outer contour of the flat cable and has contact pins for contacting the end face of the flat cable.

To ensure especially easy assembly and non-slip contacting in the contact area, the base and housing are held in a position where they can be swivel-mounted. A swivel means of this type is formed by providing fasteners in the form of hooks that are molded onto the base and corresponding mating elements that are molded onto the housing. This makes it possible to mount the one or each base in the intended location in a first step during assembly, after which the housing that is assigned to the corresponding base and has the load connections on its top and the contact pins on its bottom can be easily swivelled onto the corresponding base. To prevent mix-up between different housing variants, a mechanical coding mechanism in the form of a coding plug is provided between the housing and the base. The first time the module is assembled, this plug holds a corresponding coding socket which is anchored in a corresponding opening in the base following initial assembly, remaining there so that it cannot be lost.

Some of the advantages achieved by the present invention lie in the fact that, even if the base is separated from the housing containing the actual electric circuit, the latter can continue to be used unchanged because the cable receptacle needed for connecting a round cable and the connection to the electric circuit are implemented solely by the contact pins in the base. Once the modules have been installed, therefore, only the bases need to be replaced with bases designed for a round cable connection, while the housing itself can continue to be used.

The module can thus be operated in a harsh industrial environment with a high degree of protection. Flat cables can still be connected to the additional contact points, making it possible to switch between round and flat cables without requiring a special module for this purpose.

DETAILED DESCRIPTION

Identical components in all figures are identified by the same reference numbers.

Figure 1:
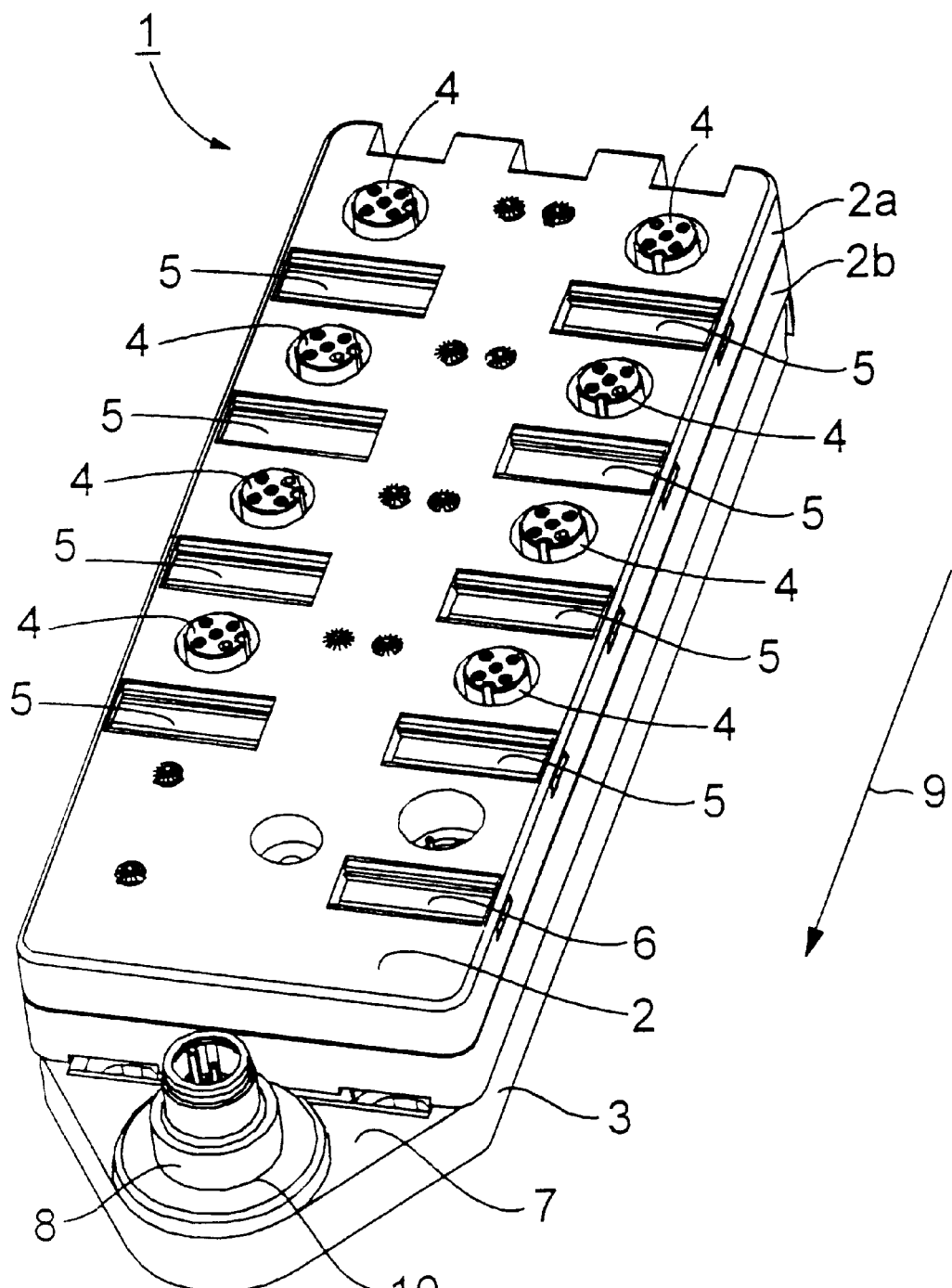
FIG. 1 shows a perspective view of a module for connecting actuators and/or sensors with a round cable connection according to the present invention.

FIG. 1 shows a module 1 for connecting multiple loads, e.g. for connecting sensors and/or actuators. Module 1 is used to exchange data between the loads and a remote master. A bus system, preferably a round cable to which module 1 is connected, serves as the connection to the master. Module 1 includes a housing 2, composed of an upper housing part 2a and a lower housing part 2b, as well as a base 3 in the form of a mounting plate. Housing 2 has an inner cavity in which a p.c. board having an electric circuit is positioned in a manner that is not illustrated in further detail.

The electric connection between the load and the circuit can be established via load connections 4. Load connections 4 form inputs and/or outputs of module 1. Load connections 4 are commercially available plug-and-screw connections with coded plug domes for connecting the loads, i.e. the actuators and/or sensors. Load connections 4 are positioned a suitable distance apart so that straight and angled connectors with integrally extruded leads as well as plugs with freely accessible terminals can be connected. The connector domes each contain up to five contact sockets that are soldered into the p.c. board. Recesses 5 for tags are provided to establish a clear assignment to the load connections or plug domes 4. A further tag recess 6 is used for holding a tag that identifies module 1 itself.

Base 3 is provided with an accommodating element 7 which holds a plug coupling 8 for connecting a round cable (not illustrated). For this purpose, accommodating element 7 is molded onto one free end of base 3 and is designed so that it has a conical shape in longitudinal direction 9 of the module. An accommodating aperture 10 for plug coupling 8 is positioned at a right angle to the plane of base 3. The outer contour of accommodating element 7 matches the circular shape of accommodating aperture 10 on the side facing away from housing 2. This rounded conical shape of accommodating element 7 is especially ergonomical and also saves material.

Figure 2:
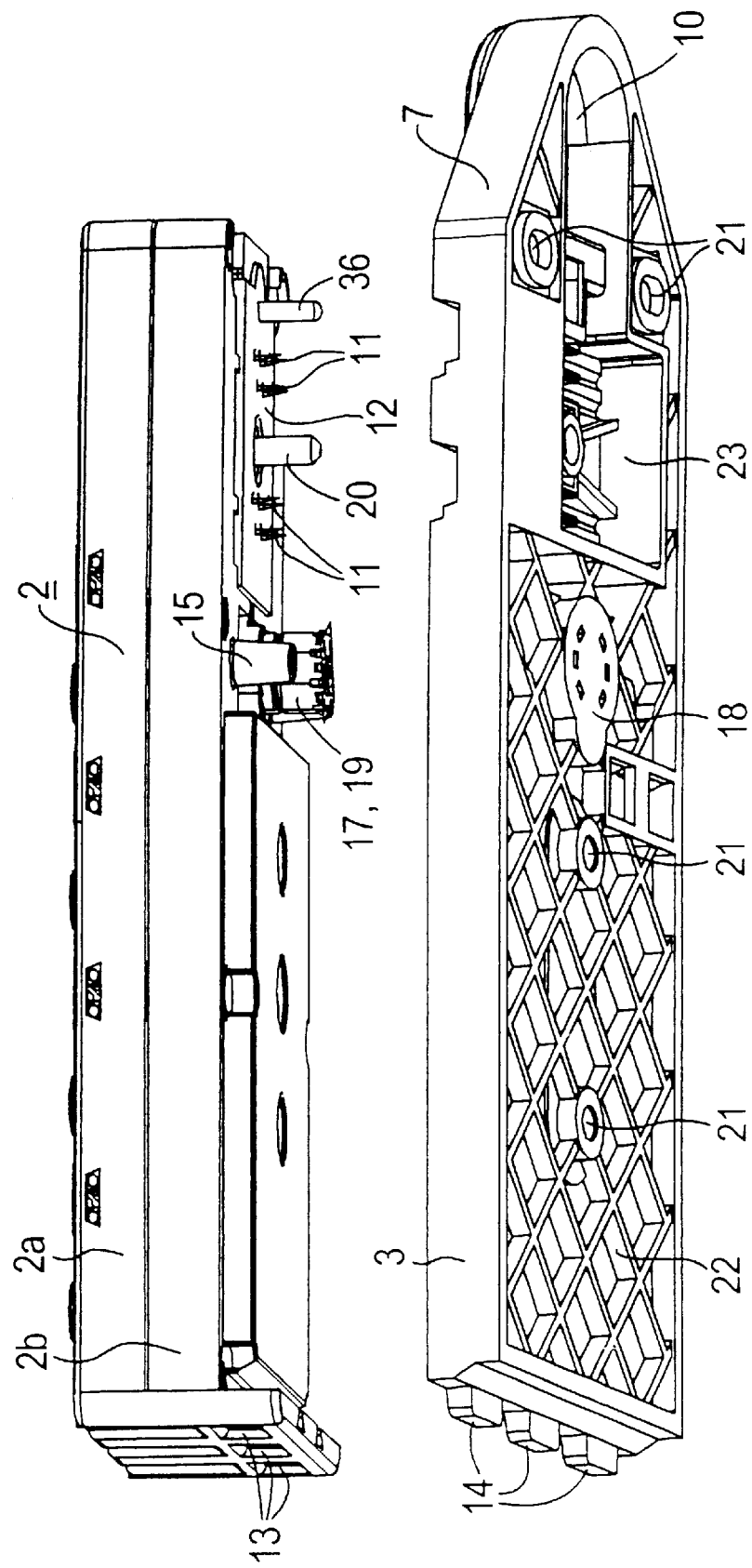
FIG. 2 shows a longitudinal perspective view from below of the module illustrated in FIG. 1 before its housing is mounted onto its base.

As shown in FIG. 2, contact pins 11 on the bottom of lower housing part 2b project out of housing 2 in a contact area 12 and are connected to the p.c. board inside housing 2 in a manner that is not illustrated in further detail. These pointed contact pins 11 of a contact unit can be contacted with corresponding contact elements (FIG. 3) using a penetration technique.

To position housing 2 on base 3 in a way that allows it to swivel, attachment recesses 13 are molded onto the end of housing 2 and can engage with mating elements 14 molded onto base 3 in the form of hooks. Housing 2 can be mounted on base 3 by swiveling housing 2 around attachment recesses 13, which act as a rotating or swivel axes. For this purpose, guide pins 15 provided on lower housing part 2b engage with corresponding openings (FIG. 3) in base 3.

To avoid mix-up between different variants when repairing or replacing housing 2, a mechanical coding mechanism is provided between housing 2 and base 3, which also has a tag recess 16 for a module-specific tag. For this purpose, a coding plug 17, which is also provided in lower housing part 2b, engages with a corresponding opening 18 in base 3. The first time the module is assembled, coding plug 17 also holds a corresponding coding socket 19, which clicks into place in corresponding opening 18 in base 3 following initial assembly, where it is subsequently held in place so that it cannot be lost. When housing 2 is removed from base 3, socket 19 thus remains in base 3 so that, after reassembly, the coding mechanism allows only an identical housing 2 to be mounted onto corresponding base 3. A fastening or locking screw 20, which is centrally located in contact area 12, pulls housing 2 against base 3. The swivel-mounted retaining mechanism with hooks 14 engaging with attachment recesses 13 holds housing 2 firmly against base 3.

The region of base 3 outside accommodating element 7 is designed so that its basic dimensions and hole pattern for fastening module 1 correspond to the commonly used modules available on the market. Holes 21 in base 3 also allow module 1 to be converted to a different attachment scheme. Providing multiple commonly used mounting hole patterns increases compatibility with other modules, thus improving its range of applications. To improve the stability of base 3, the bottom of the latter is provided with a honeycomb web pattern 22. On the bottom, i.e. on the side of base 3 opposite contact area 12, the base has a recess 23 for a connector illustrated in FIG. 3.

Figure 3:
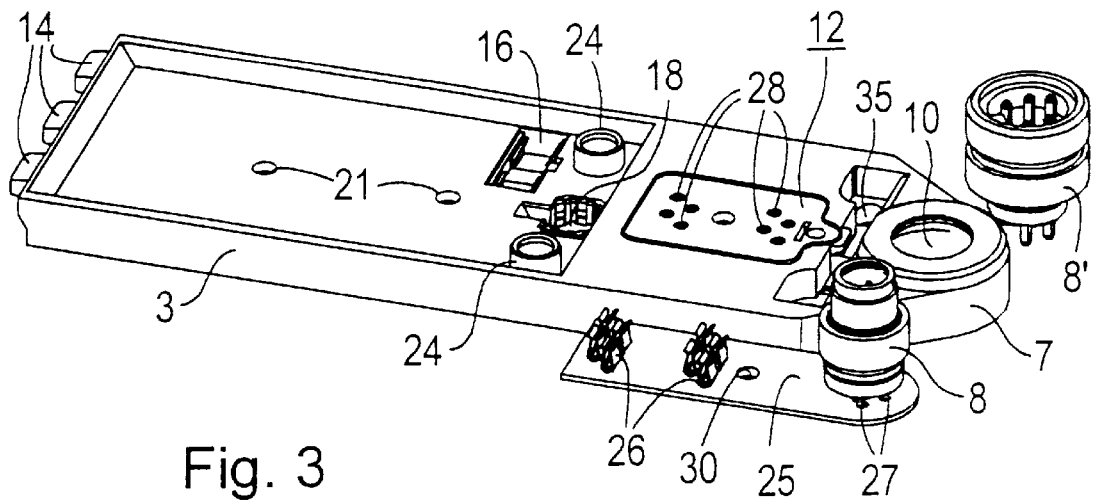
FIG. 3 shows a perspective view from above of the base illustrated in FIG. 2 and a connector for a round cable connection before the latter is inserted into the base.

FIG. 3 shows a top view of base 3, with two sockets 24 for corresponding guide pins 15 of housing 2 as well as retaining socket 18 for coding plug 17 or corresponding socket 19 being visible. Also visible are two holes 21 for attaching base 3 to it mounting location.

A connector 25 in the form of a contact plate that is separated from base 3 and is illustrated separately in FIG. 3 holds contact elements 26 corresponding to contact pins 11 as well as plug coupling 8. The associated contact feet or terminal posts 27 are connected in an electrically conductive manner to corresponding contact elements 26 on the bottom of connector 25 in a manner that is not illustrated in further detail.

During installation of the contact plate or connector 25, the latter is pressed from below against base 3 and into recess 23 so that plug coupling 8 passes through accommodating aperture 10 after connector 25 is mounted, partially extending out of this opening (FIG. 1). At the same time, contact elements 26 are positioned so that they correspond to openings 28 in contact area 12 of base 3. When housing 2 is swivelled onto base 3, contact pins 11 for establishing contact with contact elements 26 pass through these openings 28. An opening 29 (which is also centrally located) for holding screw 20 in contact area 12 also continues in connector 25 in the form of opening 30.

Contact area 12 of base 3 is provided with a recess 31 for holding a flat gasket 32 represented by the hatched area in the illustration. Flat gasket 32, which also contains all openings 28, 29 provided in contact area 12, seals off entire contact area 12.

Figure 4:
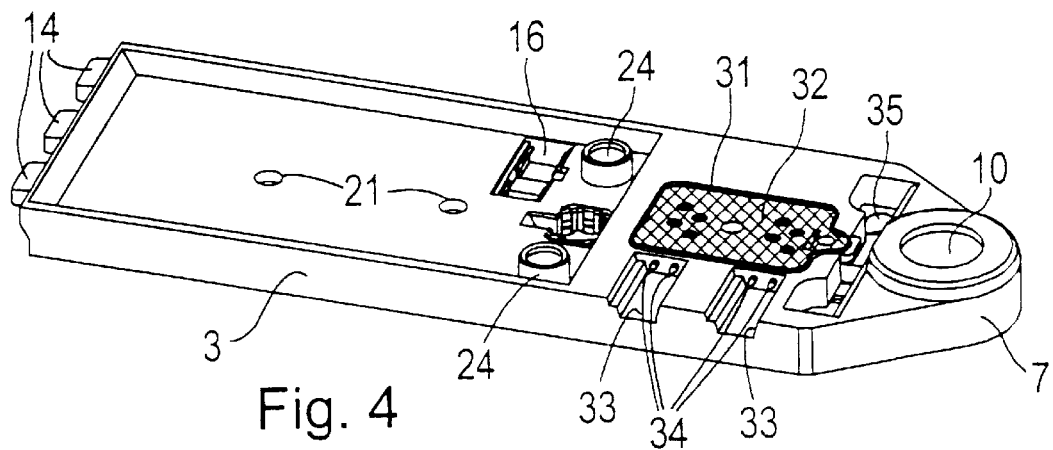
FIG. 4 shows a base according to FIG. 3 with contact points for flat cables.

FIG. 4 shows base 3 with two retaining grooves 33 provided in contact area 12 having contact spikes 34 for contacting the ends of two flat cables (not illustrated). Contact spikes 34 are connected in an electrically conductive manner to contact elements 26 of connector 25 in a manner that is not illustrated in further detail. A U-shaped recess 35 located between contact area 12 and accommodating aperture 10 serves to hold a contact or grounding plate (not illustrated) on which a ground conductor (36) projecting from housing 2 to the outside is contacted (FIG. 1). The grounding plate is then connected to a corresponding ground conductor connection of plug coupling 8 in a manner that is not illustrated in further detail.

Base 3 can be equipped with a variety of plug couplings 8, 8' for M12 or M23 plugs, for example. Commercially available round cables, for example, with molded plugs having a degree of protection up to IP 67 can be connected to these plug couplings 8, 8'. Plug coupling 8, 8' is then electrically connected to contact spikes 11 via connector 25, which thus functions as an adapter.

Figure 5:
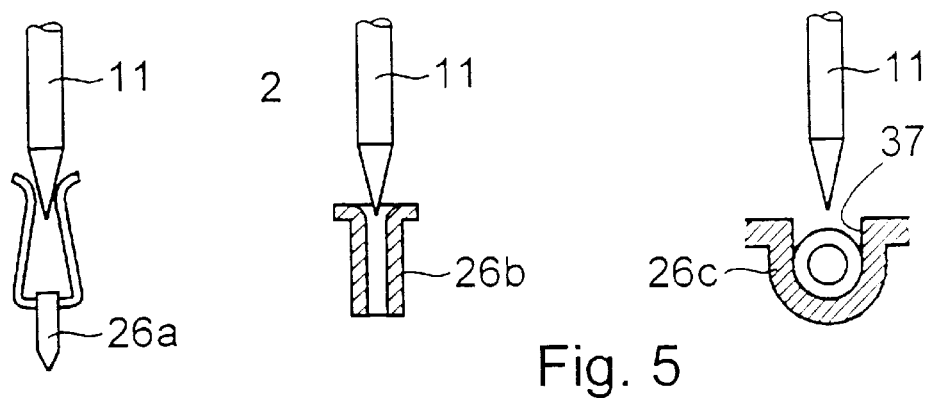
FIG. 5 shows alternative embodiments of contact elements of the connector.

As shown in FIG. 5, flat spring elements 26a, goblet springs 26b or conductor segments 26c are preferably used as contact elements 26. For this purpose, the one or each conductor segment 26c is laid in a retaining groove 37, which is suitably provided in recess 31 in contact area 12 of base 3. However, it can also be provided on connector 25.

Constructing module 1 with base 3 designed for a round cable connection and with housing 2 adapted to it provides great advantages as far as assembly and serviceability are concerned. Base 3 can be completely assembled in the location where it will be used. Next, the round cable can be connected to plug coupling 8, 8', or housing 2 can be swivelled into place on base 3, establishing contact with contact elements 26 by tightening screw 20. It is easy to replace housings 2 for repair or to use a version with modified electronics without having to touch base 3 or the cabling. The construction of module 1 also enables the latter to be easily disassembled into its constituent parts, which is also advantageous for repairing the p.c. board, for example.

What is claimed is:

1. A module for connecting at least one of an actuator and a sensor, comprising:

a housing;

a base, the housing being mountable on the base, the base including an accommodating element which projects beyond the housing when the housing is mounted on the base, the accommodating element having an aperture;

a contact unit including contact pins;

a plug coupling of a round cable connection provided in the aperture; and a connector connected in an electrically conductive manner to the plug coupling, the connector including contact elements that engage with the contact pins.

2. The module according to claim 1, wherein the accommodating element is molded onto a free end of the base, the accommodating element having a conical shape in a longitudinal direction of the module, the aperture positioned at a right angle to a plane of the base.

3. The module according claim 2, wherein the accommodating element has an outer contour that matches a circular shape of the aperture.

4. The module according to claim 1, wherein the connector is a contact plate what is mountable on the base and holds the plug coupling, corresponding openings in a contact area of the base being assigned to the contact elements, the contact pins passing through the openings after assembly to establish contact with the contact elements.

5. The module according to claim 1, wherein at least one of the contact elements is a spring element.

6. The module according to claim 4, wherein at least one of the contact elements is a conductor segment which is posited in a retraining groove, the retaining groove being provided in the contact area.

7. The module according to claim 6, wherein the base has a recess for a flat gasket, the flat gasket for sealing the contact area.

8. The module according to claim 1, wherein the housing is held in a position where it can be swivel-mounted on the base.

9. The module according to claim 8, wherein the base includes molded hooks and an upper portion of the housing includes attachment recesses corresponding to the molded hooks, the hooks and the attachment recesses forming a swivel means for positioning the housing so that the housing can be swivel-mounted on the base.

10. The module according to claim 1, wherein a contact area of the base has at least one retaining groove matching an outer contour of a flat cable with contact pins for establishing contact with an end of the flat cable.

11. The module according to claim 1, further comprising:

a mechanical coding mechanism including a coding plug and a coding socket, the coding socket being held by the coding plug, the coding socket remaining in a corresponding opening in the base following initial assembly.

12. The module according to claim 1, wherein the base has a recess for holding a grounding plate.

\* \* \* \* \*